United States Patent
Marchisi

(10) Patent No.: US 9,640,464 B2
(45) Date of Patent: May 2, 2017

(54) PACKAGE FOR A SURFACE-MOUNT SEMICONDUCTOR DEVICE AND MANUFACTURING METHOD THEREOF

(71) Applicant: STMicroelectronics S.r.l., Agrate Brianza (IT)

(72) Inventor: Fabio Marchisi, Peschiera Borromeo Milano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/235,373

(22) Filed: Aug. 12, 2016

(65) Prior Publication Data

US 2016/0351477 A1    Dec. 1, 2016

Related U.S. Application Data

(62) Division of application No. 14/840,663, filed on Aug. 31, 2015.

(30) Foreign Application Priority Data

Dec. 10, 2014    (IT) .............................. TO2014A1027

(51) Int. Cl.
    *H01L 21/44*      (2006.01)
    *H01L 23/495*     (2006.01)
    (Continued)

(52) U.S. Cl.
    CPC .... *H01L 23/49503* (2013.01); *H01L 21/2885* (2013.01); *H01L 21/3105* (2013.01);
    (Continued)

(58) Field of Classification Search
    CPC ... H01L 21/78; H01L 21/3105; H01L 21/302; H01L 21/565; H01L 24/48; H01L 24/85; H01L 24/92; H01L 24/97
    (Continued)

(56) References Cited

U.S. PATENT DOCUMENTS

| | | |
|---|---|---|
| 5,654,585 A | 8/1997 | Nishikawa |
| 6,191,494 B1 | 2/2001 | Ooyama et al. |

(Continued)

OTHER PUBLICATIONS

IT Search Report and Writtten Opinion for IT TO2014A001027 mailed Aug. 21, 2015 (8 pages).

*Primary Examiner* — Nitin Parekh
(74) *Attorney, Agent, or Firm* — Gardere Wynne Sewell LLP

(57) ABSTRACT

A method for manufacturing a surface-mount electronic device includes making a first partial cut from a bottom of an assembly that includes a first semiconductor body that is disposed on a first die pad, a second semiconductor body that is disposed on a second die pad, and a plurality of terminal regions that is disposed between the first and second die pads. The first partial cut forms a recess by removing a portion of each of the terminal regions. The recess is defined by a transverse wall, a first sidewall, and a second sidewall. The first and second sidewalls and the transverse wall are coated with an anti-oxidation layer. A second partial cut is made from the top, where the second partial cut removes the transverse wall, separates the first and second semiconductor bodies, and has a width that is greater than a width of the first partial cut.

14 Claims, 8 Drawing Sheets

(51) Int. Cl.
   *H01L 21/56*     (2006.01)
   *H01L 23/00*     (2006.01)
   *H01L 21/48*     (2006.01)
   *H01L 21/288*    (2006.01)
   *H01L 21/3105*   (2006.01)
   *H01L 25/065*    (2006.01)
   *H01L 25/00*     (2006.01)
   *H01L 23/31*     (2006.01)

(52) U.S. Cl.
   CPC ...... *H01L 21/4825* (2013.01); *H01L 21/4842* (2013.01); *H01L 21/561* (2013.01); *H01L 21/565* (2013.01); *H01L 23/3114* (2013.01); *H01L 23/3135* (2013.01); *H01L 23/4952* (2013.01); *H01L 23/49541* (2013.01); *H01L 23/49548* (2013.01); *H01L 23/49575* (2013.01); *H01L 23/49582* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/97* (2013.01); *H01L 25/0655* (2013.01); *H01L 25/50* (2013.01); *H01L 23/3121* (2013.01); *H01L 2224/32245* (2013.01); *H01L 2224/48091* (2013.01); *H01L 2224/48106* (2013.01); *H01L 2224/48247* (2013.01); *H01L 2224/48465* (2013.01); *H01L 2224/73265* (2013.01); *H01L 2224/92247* (2013.01); *H01L 2224/97* (2013.01); *H01L 2924/00014* (2013.01); *H01L 2924/14* (2013.01); *H01L 2924/1461* (2013.01); *H01L 2924/17747* (2013.01); *H01L 2924/181* (2013.01)

(58) Field of Classification Search
   USPC .................................. 438/112, 113; 257/666
   See application file for complete search history.

(56) References Cited

U.S. PATENT DOCUMENTS

| | | | |
|---|---|---|---|
| 6,399,415 | B1 | 6/2002 | Bayan et al. |
| 6,713,849 | B2 | 3/2004 | Hasebe et al. |
| 6,723,585 | B1* | 4/2004 | Tu ........................ H01L 23/3107 174/530 |
| 8,519,518 | B2* | 8/2013 | Do ....................... H01L 21/4832 257/666 |
| 2004/0046240 | A1* | 3/2004 | Hasebe ............... H01L 21/4842 257/678 |
| 2004/0238923 | A1 | 12/2004 | Lee et al. |
| 2005/0116321 | A1 | 6/2005 | Li et al. |
| 2007/0052070 | A1* | 3/2007 | Islam .................... H01L 21/561 257/666 |
| 2007/0126092 | A1* | 6/2007 | San Antonio ......... H01L 21/561 257/674 |
| 2010/0078803 | A1 | 4/2010 | Andou et al. |
| 2011/0278638 | A1* | 11/2011 | Lin ....................... H01L 21/486 257/99 |
| 2012/0292755 | A1 | 11/2012 | Wang |
| 2013/0221509 | A1* | 8/2013 | Oda ........................ H01L 33/48 257/676 |
| 2013/0277817 | A1* | 10/2013 | Takeuchi ................ H01L 23/34 257/676 |
| 2014/0035113 | A1* | 2/2014 | Kierse .................... H01L 24/97 257/676 |
| 2014/0306330 | A1* | 10/2014 | Williams .......... H01L 23/49541 257/675 |
| 2015/0076675 | A1* | 3/2015 | Real ........................ H01L 24/97 257/676 |
| 2015/0221584 | A1 | 8/2015 | Lopez et al. |
| 2016/0254214 | A1* | 9/2016 | Makino ................... H01L 24/97 257/676 |

* cited by examiner

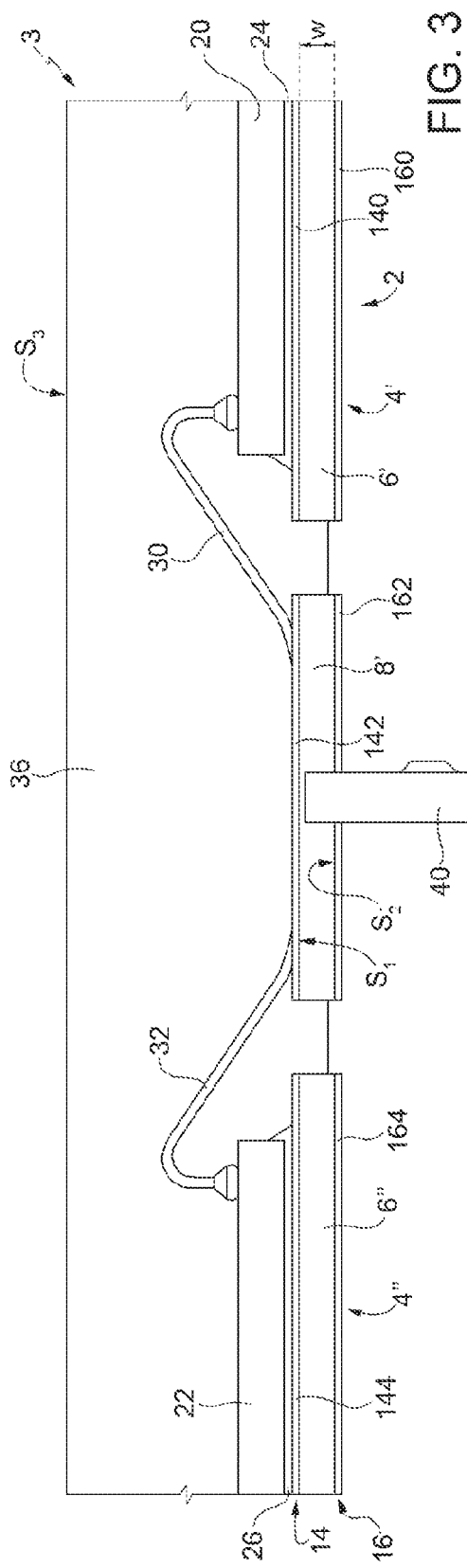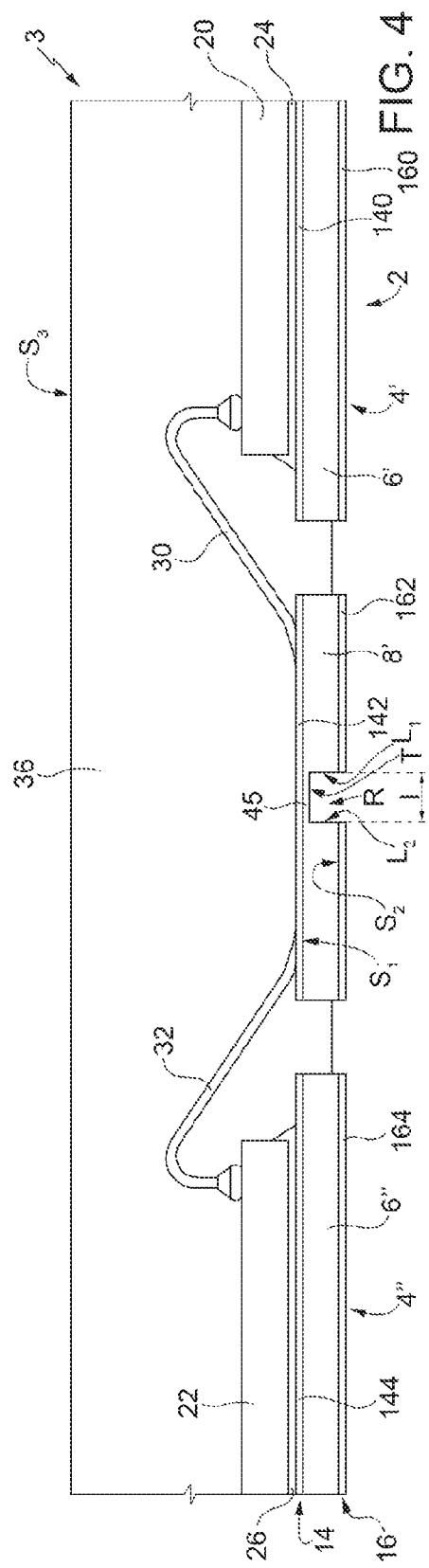

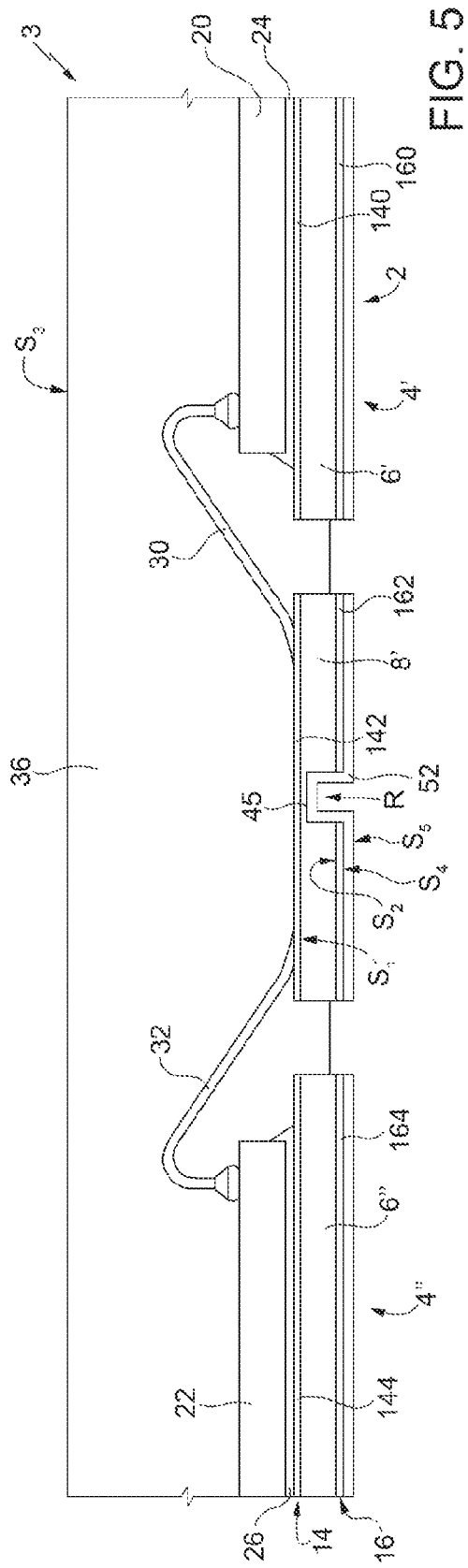
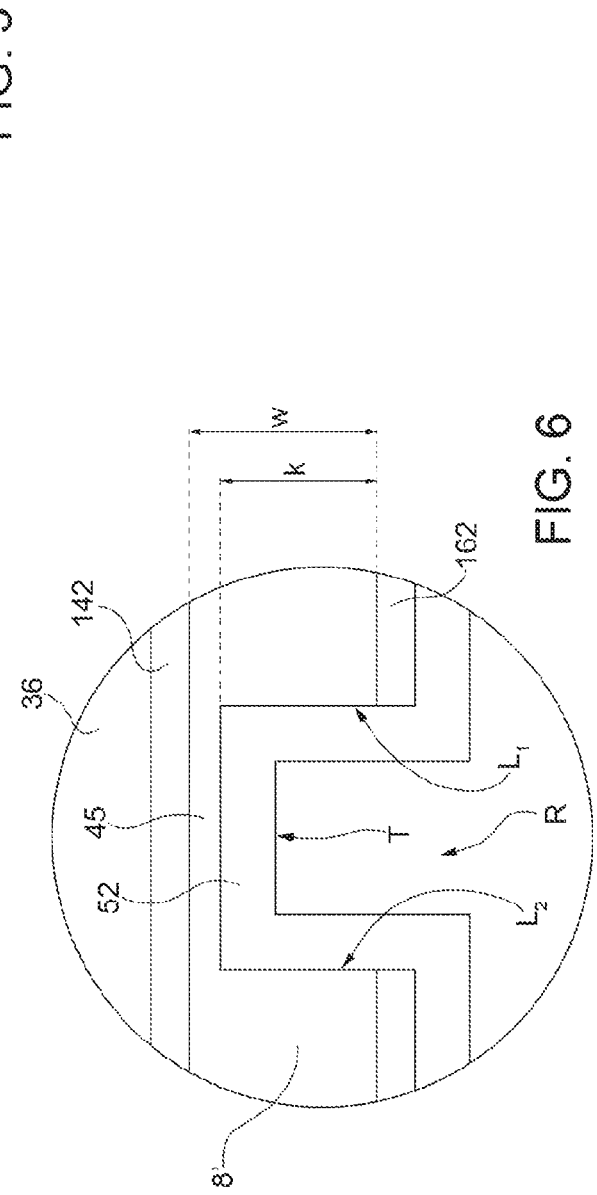

PACKAGE FOR A SURFACE-MOUNT SEMICONDUCTOR DEVICE AND MANUFACTURING METHOD THEREOF

CROSS REFERENCE TO RELATED APPLICATIONS

This application is a divisional of U.S. patent application Ser. No. 14/840,663, filed on Aug. 31, 2015, which claims the priority benefit of Italian Patent Application No. TO2014A001027 filed on Dec. 10, 2014, the disclosures of which are hereby incorporated by reference.

TECHNICAL FIELD

The present invention relates to manufacturing of a surface-mount semiconductor device, and more particularly to methods for manufacturing a package for a surface-mount semiconductor device and a packaged surface-mount semiconductor device.

BACKGROUND

Semiconductor devices, such as for example integrated circuits and micro-electro-mechanical systems (MEMS) devices, are packaged inside corresponding packages, which perform functions of protection and interfacing with the outside world. For example, packages are known that enable so-called "surface mounting" on a printed-circuit board.

In greater detail, surface-mount packages include, for example, packages of a "quad-flat no-leads" (QFN) type, also known as "micro lead frame" (MLF) packages or "small-outline no-leads" (SON) packages.

In general, a QFN package includes a region of resin on a lead frame, which forms at least one array of terminals that are exposed by a bottom surface of the package.

Small dimensions and good electrical and thermal performance characterize QFN packages. However, it is frequently problematic to inspect and ensure that soldering on the printed-circuit board has been carried out properly. In fact, visual inspection of the welds present between the terminals and the corresponding pads of the printed-circuit board is hindered by the very arrangement of the terminals on the bottom surface of the package. U.S. Patent Application Publication No. 2005/0116321 by Felix et al., which is hereby incorporated by reference, describes a method for manufacturing a package in which the terminals are formed by punching in such a way as to present a recess facing the printed-circuit board. In this way, the terminals form a surface that remains exposed during the operations of application of the soldering paste. Further, the package is such that, when it is soldered on the printed-circuit board, corresponding soldering joints are present between the terminals of the package and the pads of the printed-circuit board. The soldering joints may be noted and inspected visually in a relatively easy way. However, the angle under which each soldering joint is visible is not particularly wide, nor is the weldable area of each terminal.

The present disclosure provides a package for a semiconductor device that solves, at least in part, the drawbacks of the known art.

SUMMARY

A surface-mount electronic device includes a body of semiconductor material, and a lead frame that forms a plurality of contact terminals. A package dielectric region overlies the body of semiconductor material, and each contact terminal includes an inner portion that is overlaid by the package dielectric region and an outer portion that projects laterally beyond the package dielectric region and is delimited by a first lateral surface. According to one embodiment, an anti-oxidation layer is disposed on the first lateral surface. According to an alternate embodiment, the inner portion forms a second lateral surface, and a transverse surface of the outer portion is connected to the first and second lateral surfaces.

A method for manufacturing a surface-mount electronic device according to the teachings of the present disclosure includes applying a semiconductor material to a first and a second die pad to form a first and second semiconductor die. The first and second semiconductor dies are electrically connected to a terminal region that is disposed between the first and second semiconductor dies. A molding compound is applied to the first semiconductor die, the top side of the terminal region, and the second semiconductor die. A first partial cut is made through a bottom side of the terminal region where the bottom side is disposed opposite the top side of the terminal region. The first partial cut forms a first recess that is defined by a pair of sidewalls and a transverse wall. A distance between the sidewalls defines a first recess width. The pair of sidewalls is coated with an anti-oxidation layer. A second partial cut is made through the molding compound and the top side of the terminal region. A depth of the second partial cut extends into the first recess to sever the terminal region. The width of the second partial cut is greater than the first recess width.

BRIEF DESCRIPTION OF THE DRAWINGS

For a better understanding of the present invention, preferred embodiments thereof are now described, purely by way of non-limiting example and with reference to the attached drawings, wherein:

FIGS. 2-5, 7, 9, and 11 are schematic cross-sectional views that show successive steps of a packaging method according to one embodiment of the present semiconductor device;

FIG. 6 is an enlarged schematic view of a portion shown in FIG. 5;

DETAILED DESCRIPTION

Figure 1B:
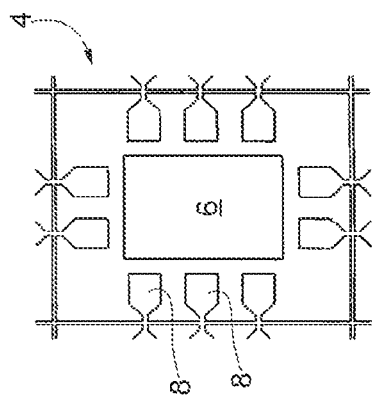
FIG. 1B shows an enlarged view of a portion of the lead-frame strip shown in FIG. 1A.
Figure 1A:
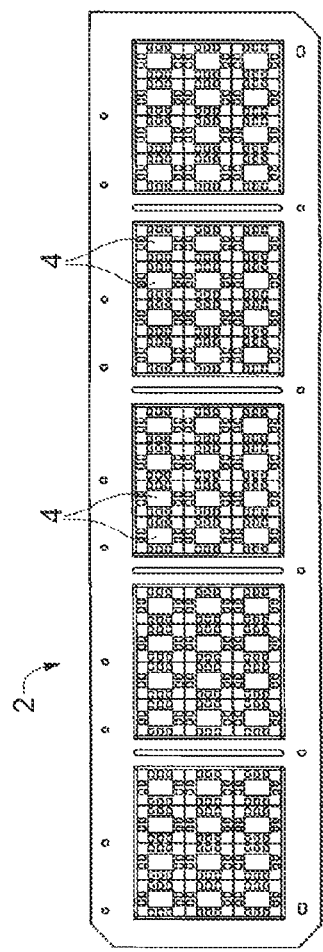
FIG. 1A is a schematic top plan view of a lead-frame strip.

FIG. 1A shows, by way of example, a lead-frame strip 2, which is of a known type and is formed of conductive material (for example, copper). The lead-frame strip 2 includes a plurality of device areas 4, each of which in turn includes a respective die pad 6, shown in greater detail in FIG. 1B. In addition, the lead-frame strip 2 includes a plurality of contact regions 8.

Figure 2:
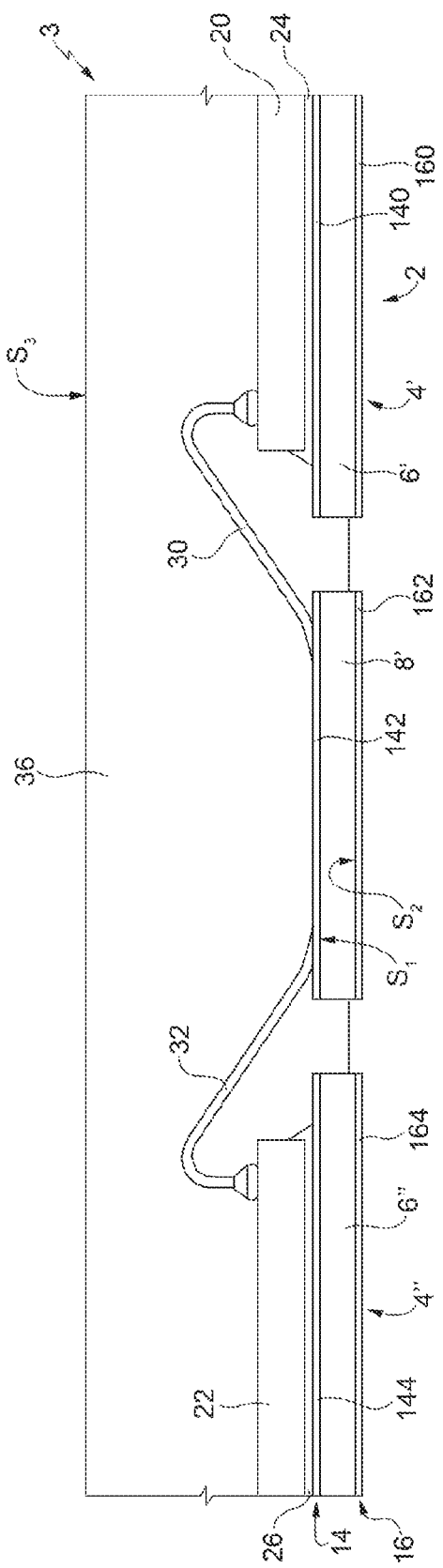

FIG. 2 shows an assembly 3, which, by way of example, includes the lead-frame strip 2, and in particular includes a first device area 4' and a second device area 4". The first device area 4' includes a first die pad 6' and the second device area 4" includes a second die pad 6". Further, the assembly 3 includes a contact region 8', which extends between the first and second die pads 6', 6", at a distance therefrom. The top surfaces of the contact region 8' and of the first and second die pads 6', 6" define a first surface $S_1$, whereas the bottom surfaces of the contact region 8' and of the first and second die pads 6', 6" define a second surface $S_2$.

The lead-frame strip 2 is of the pre-plated type, and consequently includes a first coating layer 14 and a second coating layer 16, which are made, for example, of tin.

The first coating layer 14 extends over the first surface $S_1$, and thus over the contact region 8' and the first and second die pads 6', 6", with which it is in direct contact. The second coating layer 16 extends underneath the second surface $S_2$, and thus underneath the contact region 8' and the first and second die pads 6', 6", with which it is in direct contact.

In particular, the first coating layer 14 includes a first pad portion 140, a second pad portion 144, and a contact portion 142. The first pad portion 140, the second pad portion 144, and the contact portion 142 of the first coating layer 14 extend, respectively, on the first die pad 6', the second die pad 6", and the contact region 8'.

The second coating layer 16 includes a first pad portion 160, a second pad portion 164, and a contact portion 162. The first pad portion 160, second pad portion 164, and contact portion 162 of the second coating layer 16 extend, respectively, underneath the first die pad 6', the second die pad 6", and the contact region 8'.

The assembly 3 further includes a first die 20 and a second die 22, which are fixed, respectively, to the first pad portion 140 and to the second pad portion 144 of the first coating layer 14, by interposition, respectively, of a first bonding layer 24 and a second bonding layer 26.

Further, the assembly 3 includes a first conductive wire 30 and a second conductive wire 32. The first conductive wire 30 electrically connects the first die 20 to the contact portion 142 of the first coating layer 14, with which it forms a first wire bonding. The second conductive wire 32 electrically connects the second die 22 to the contact portion 142 of the first coating layer 14, with which it forms a second wire bonding.

The assembly 3 may be previously formed as is known in the art and further includes a molding compound 36, which is made, for example, of a thermosetting epoxy resin and overlies, as is known in the art, the first die 20 and the second die 22, as well as the lead-frame strip 2. The molding compound 36 also extends at least in partially in the gaps between the first and second die pads 6', 6" and the contact region 8'. In what follows the molding compound 36 will be referred to as resin region 36. Further, the resin region 36 is delimited at the top by a respective surface $S_3$, which will be referred to hereinafter as third surface $S_3$.

According to the manufacturing method of the present disclosure, a selective removal of a portion of lead-frame strip 2 is carried out, as shown in FIG. 3. This removal and the subsequent steps are described in what follows, with particular reference to the effects produced in the contact region 8', except where otherwise specified.

A first partial cut is made using a first blade 40 having at least locally a rectangular cross-section. This first cut is made from beneath, starting from the contact portion 162 of the second coating layer 16 for removing a part of this contact portion 162, as well as an overlying portion of the contact region 8'.

In greater detail, if w is the thickness of the contact region 8', the first cut is such that the removed portion of the contact region 8' has a thickness k<w; for example k=w·0.8.

Also shown in FIG. 4, the first cut is such that a recess R is formed within the contact region 8'. Extending on top of the recess R is a non-removed portion of the contact region 8', which will be referred to hereinafter as "residual region 45". The residual region 45 has a thickness equal to w−k. It should be noted that the recess R is a recess that extends also through the other contact regions 8 that form the array to which the contact region 8' belongs, as well as between the portions of resin region 36 arranged in between. However, for simplicity of description, the recess R is described with particular reference to the portion formed by the contact region 8'.

The recess R is delimited laterally by a first sidewall $L_1$ and a second sidewall $L_2$, which are formed by the contact region 8' and, to a lesser extent, by the contact portion 162 of the second coating layer 16. In addition, the recess R is delimited at the top by a top wall T, which is formed by the residual region 45.

The first and second sidewalls $L_1$, $L_2$ are parallel to one another. Further, the recess R has a width l, measured in a direction perpendicular to the direction of the first cut. In practice, the first and second sidewalls $L_1$, $L_2$ are at a distance from one another equal to the width l.

Next, as shown in FIG. 5 and, in greater detail, in FIG. 6, a plating process is carried out, described in what follows with particular reference to the effects produced on the contact region 8'.

The bottom surface of the second coating layer 16 is designated as "fourth surface $S_4$". The plating forms a layer 52 underneath and in direct contact with the fourth surface $S_4$. In what follows, the layer 52 will be referred to as "third coating layer 52".

The third coating layer 52 may be made, for example, of tin. Further, the top wall T and the first and second sidewalls $L_1$, $L_2$ are also coated with the third coating layer 52. The third coating layer 52 does not extend in contact with the resin region 36.

The aforementioned plating may be carried out, for example, by electroplating, in a known manner. In this case, a potential is applied to the contact region 8', which, due to the presence of the residual region 45, forms a single electrical node.

Figure 7:
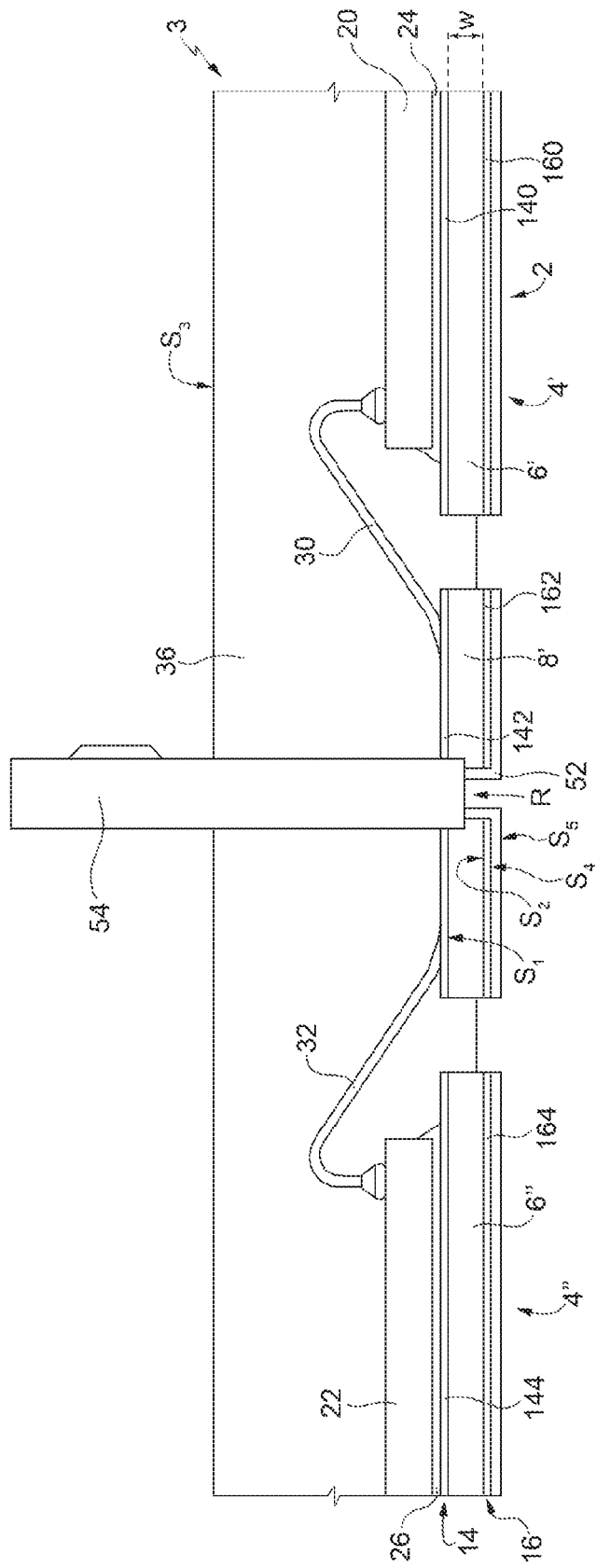

Next, as shown in FIG. 7, a second partial cut is made using a second blade 54 having at least locally a rectangular cross-section. This second cut is made from above, starting from the resin region 36, to be substantially vertically aligned with respect to the recess R. In what follows, the second cut is described with particular reference to the effects produced in the contact region 8', except where otherwise specified.

Figure 8:
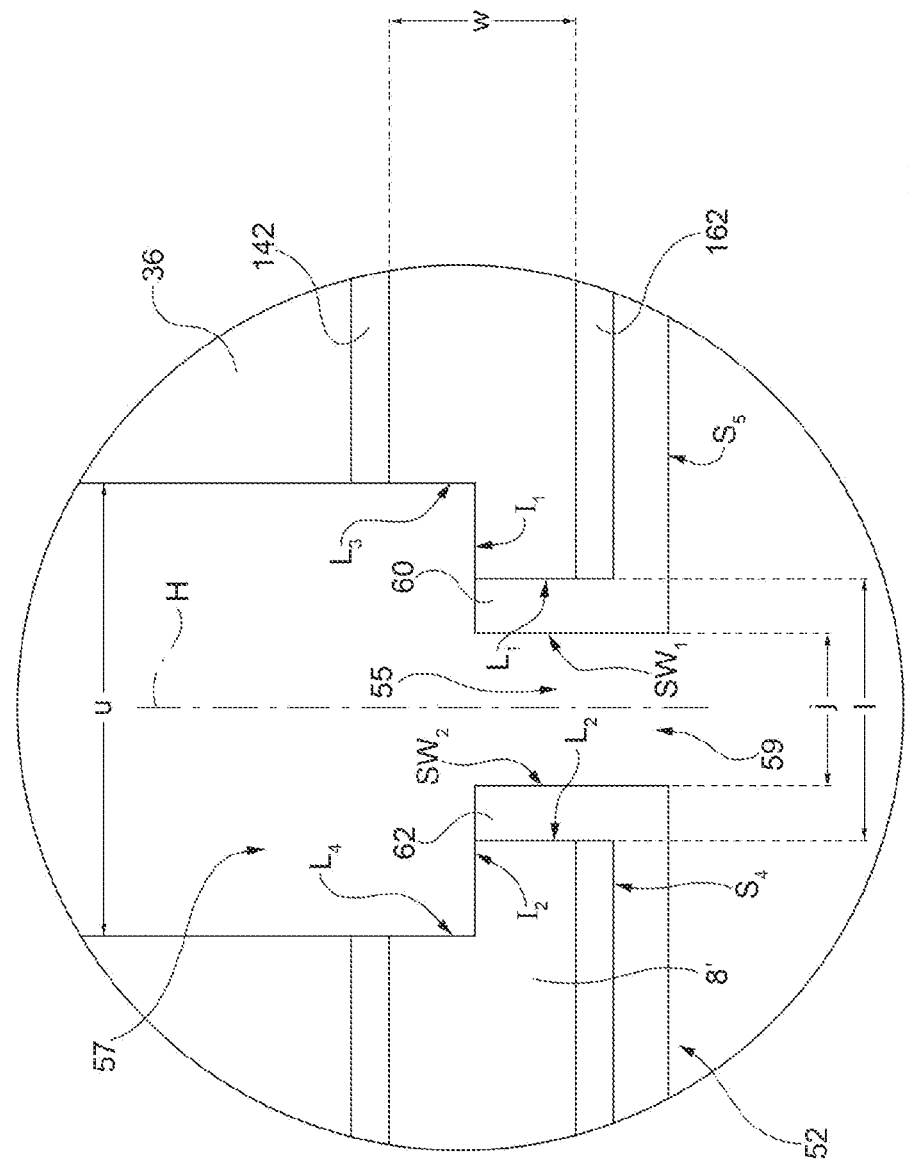
FIG. 8 is an enlarged schematic view of a portion shown in FIG. 7.

As shown in greater detail in FIG. 8, the second cut leads to complete removal of the residual region 45. More precisely, the second blade 54 is wider than the first blade 40. Thus, the second cut leads to removal of a top portion of the contact region 8', which includes the residual portion 45. Further, the second blade 54 penetrates within the contact region 8' for an extent at least equal to w−k+s, where s is the thickness of the third coating layer 52. Consequently, the second cut also leads to removal of the portion of third coating layer 52 that extends in contact with the top wall T, and thus leads to formation of a split 55 in the contact region 8', which has a longitudinal axis H. In addition, in the case where the second blade 54 penetrates within the contact region 8' for an extent greater than w−k+s, portions of the contact region 8' arranged underneath the aforementioned top portion of the contact region 8' and adjacent to the first and second sidewalls $L_1$, $L_2$ are also removed. In other words, a part of the contact region 8' that surrounds a top portion of the recess R is removed.

In what follows, the split 55 is described with particular reference to the portion that extends through the contact region 8', except where otherwise specified.

The split 55 traverses the resin region 36, the contact portion 142 of the first coating layer 14, the contact region 8' and the contact portion 162 of the second coating layer 16. In other words, if we designate the bottom surface of the third coating layer 52 by "fifth surface $S_5$", the split 55 extends between the third surface $S_3$ and the fifth surface $S_5$.

The split 55 has a top portion 57 and a bottom portion 59, which form corresponding recesses that communicate and are vertically aligned with one another.

The top portion 57 is delimited laterally by a third sidewall $L_3$ and a fourth sidewall $L_4$, which are parallel to one another and to the first and second sidewalls $L_1$, $L_2$. Further, the top portion 57 has a width u, greater than the width l of the recess R. In greater detail, each of the third sidewall $L_3$ and the fourth sidewall $L_4$ is formed in part by the resin region 36, in part by the contact portion 142 of the first coating layer 14, and in part by the contact region 8'.

The bottom portion 59 has a width j=l-2·s, since the first and second sidewalls $L_1$, $L_2$ are now coated with corresponding portions of the third coating layer 52, which will be referred to hereinafter as "first and second protective regions 60, 62", for reasons that will be clarified hereinafter. The first and second protective regions 60, 62 further extend also in contact with the fourth surface $S_4$.

A bottom portion of the third sidewall $L_3$ is formed by the contact region 8' and is connected to the first sidewall $L_1$ via a first intermediate wall $I_1$, which is also formed by the contact region 8' and is substantially perpendicular to the first and third sidewalls $L_1$, $L_3$. Likewise, a bottom portion of the fourth sidewall $L_4$ is formed by the contact region 8' and is connected to the second sidewall $L_2$ via a second intermediate wall $I_2$, which is also formed by the contact region 8' and is substantially perpendicular to the second and fourth sidewalls $L_2$, $L_4$. In practice, the first and second intermediate walls $I_1$, $I_2$ have been exposed following the second cut and extend from the third and fourth sidewalls $L_3$, $L_4$, respectively, towards the inside of the split 55, until they connect, respectively, with the first and second sidewalls $L_1$, $L_2$. In this way, the first and third sidewalls $L_1$, $L_3$ form, together with the first intermediate wall $I_1$, a first shoulder, a bottom portion of which is coated by the first protective region 60, whereas the second and fourth sidewalls $L_2$, $L_4$ form, together with the second intermediate wall $I_2$, a second shoulder. The second protective region 62 coats a bottom portion of the second shoulder. The first and second protective surfaces $SW_1$, $SW_2$ are, respectively, the surfaces of the first and second protective regions 60, 62 that are arranged parallel to the longitudinal axis H, and thus are the surfaces facing the split 55 of the portions of the first and second protective regions 60, 62 that coat the first and second sidewalls $L_1$, $L_2$.

Figure 9:
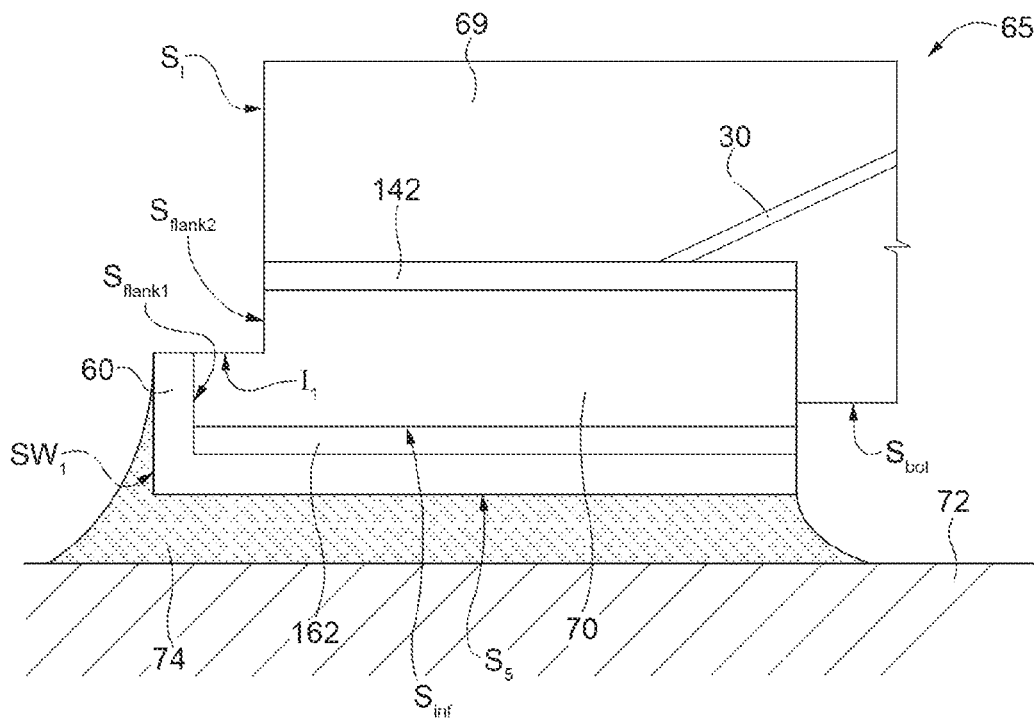

The second cut further leads to dicing of the assembly 3, and thus separation of the first and second dies 20, 22. In particular, with reference, for example, to the first die 20, this forms a corresponding electronic device 65, as shown in FIG. 9.

After dicing, the portion of resin region 36 fixed with respect to the first die 20 forms a package dielectric region 69 (also known as "cap"), whereas the portion of the lead-frame strip 2 fixed with respect to the first die 20 forms the lead frame of the electronic device 65. Further, the portion of the contact region 8' fixed with respect to the first die 20 forms a corresponding terminal 70 of the electronic device 65. Albeit not shown, the terminal 70 belongs to a corresponding first array of terminals that are for example the same as one another and arranged on a first side of the electronic device 65, which in turn may include a second array of terminals, which is, for example, identical to the first array and is arranged on a second side of the electronic device 65, opposite to the first side. Further, it is possible for the electronic device 65 to be, for example, of a quad-flat no-leads (QFN) type.

The package dielectric region 69 is delimited by a lateral surface $S_1$, which will be referred to hereinafter as "lateral surface of the package $S_1$". Further, the package dielectric region 69 is delimited at the bottom by a surface $S_{bot}$, which will be referred to hereinafter as "package bottom surface $S_{bot}$".

The terminal 70 is delimited at the bottom by a portion of the second surface $S_2$, which will be referred to hereinafter as "terminal bottom surface $S_{inf}$". Further, the terminal 70 includes an inner portion, which is overlaid by the package dielectric region 69, and an outer portion, which projects outwards with respect to the package dielectric region 69 and is delimited laterally by a portion of the first sidewall $L_1$, which will be referred to hereinafter as "first terminal lateral surface $S_{flank1}$". Further, the outer portion of the terminal 70 is delimited at the top by the first intermediate wall $I_1$. In a top plan view (not shown), the outer portion of the terminal 70 projects beyond the perimeter that is defined by the shape of the package dielectric region 69.

The inner portion of the terminal 70 has, in turn, a top portion, which faces the package dielectric region 69 and is delimited laterally by a respective lateral surface, which will be referred to hereinafter as "second terminal lateral surface $S_{flank2}$"; the second terminal lateral surface $S_{flank2}$ is coplanar with the package lateral surface $S_1$.

Figure 10:
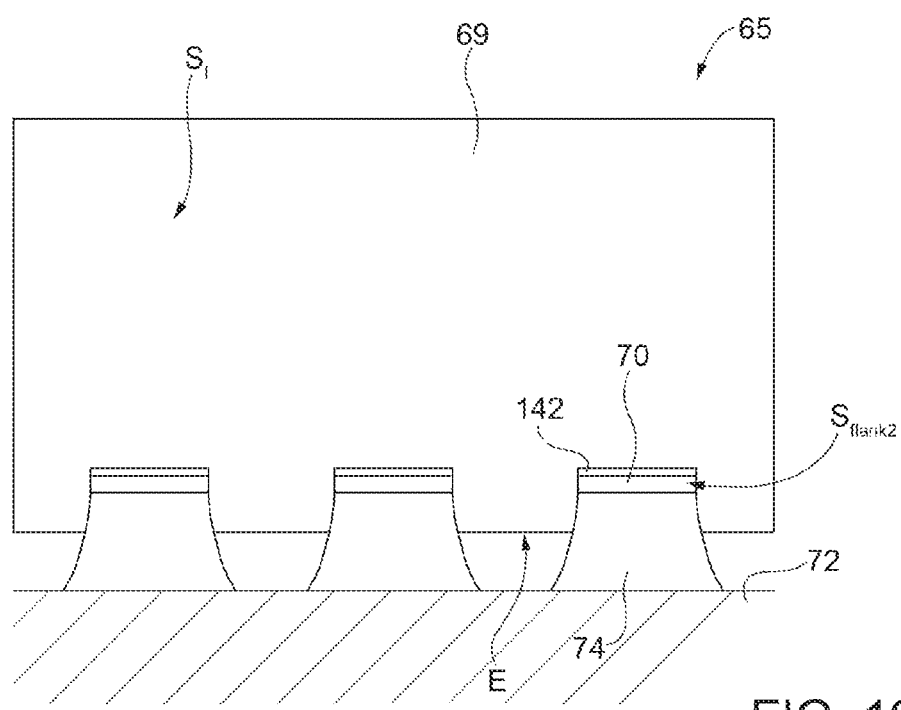
FIG. 10 is a schematic side view of an electronic device.

As shown in FIG. 10, the intersection between the package lateral surface $S_1$ and the package bottom surface $S_{bot}$ defines an edge E. In addition, the terminal 70 extends along the edge E.

The electronic device 65 may be soldered to a printed-circuit board 72 by forming a temporary fixing region 74 between the terminal 70 and the printed-circuit board 72.

A solder paste of a known type forms the temporary fixing region 74; for example, the solder paste may be tin-based and may contain a flux. Further, the temporary fixing region 74 extends, not only underneath the fifth surface $S_5$, but also in contact with the first protective surface $SW_1$.

Figure 11:
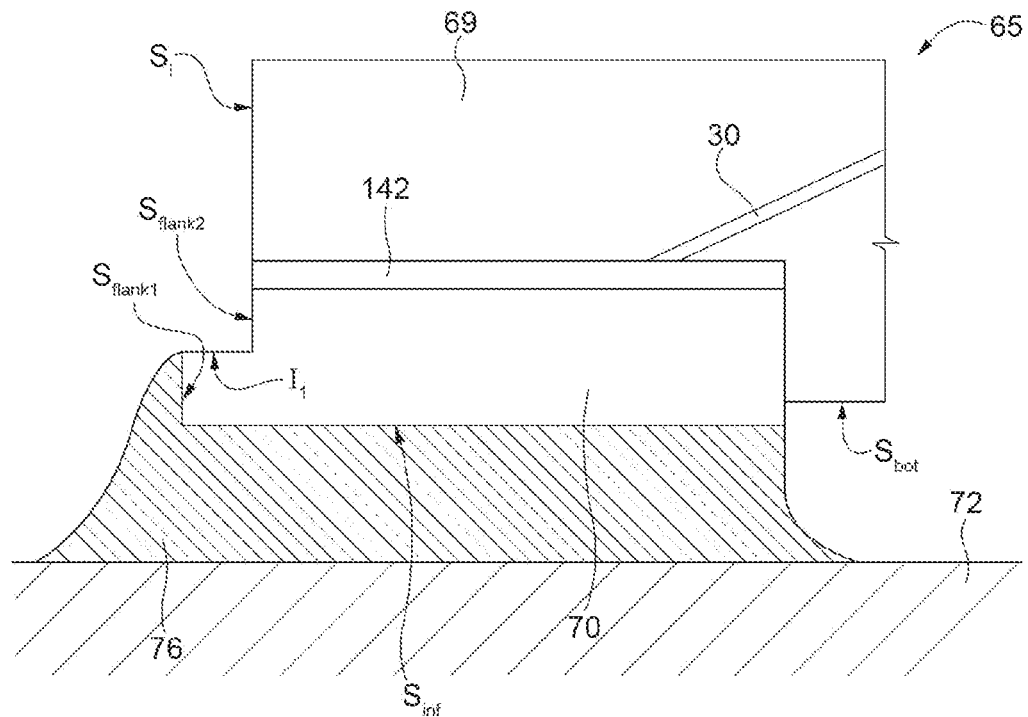

Following upon soldering, and thus following upon a thermal process and consequent melting of the first protective region 60, a final fixing region 76 (shown in FIG. 11) is formed, which is formed of tin and is arranged between the terminal 70 and the printed-circuit board 72. In particular, the final fixing region 76 extends, not only in contact with the terminal bottom surface $S_{inf}$, but also in contact with the first terminal lateral surface $S_{flank1}$. In fact, due to the presence of the first protective region 60, the first terminal lateral surface $S_{flank1}$ has not been previously subjected to oxidation, and consequently the material that forms the first terminal lateral surface $S_{flank1}$ may be wetted by the tin present in liquid phase during the soldering step. As such, the first protective region 60 may be referred to as an anti-oxidation layer or an anti-oxidizing region. Intermetallic bonds may thus form between the material of the terminal 70 and the metal material present in the solder paste.

The final fixing region 76 may be easily inspected, due at least in part to the fact that it extends, not only underneath the terminal bottom surface $S_{inf}$, but also on the first terminal lateral surface $S_{flank1}$.

Figure 12:
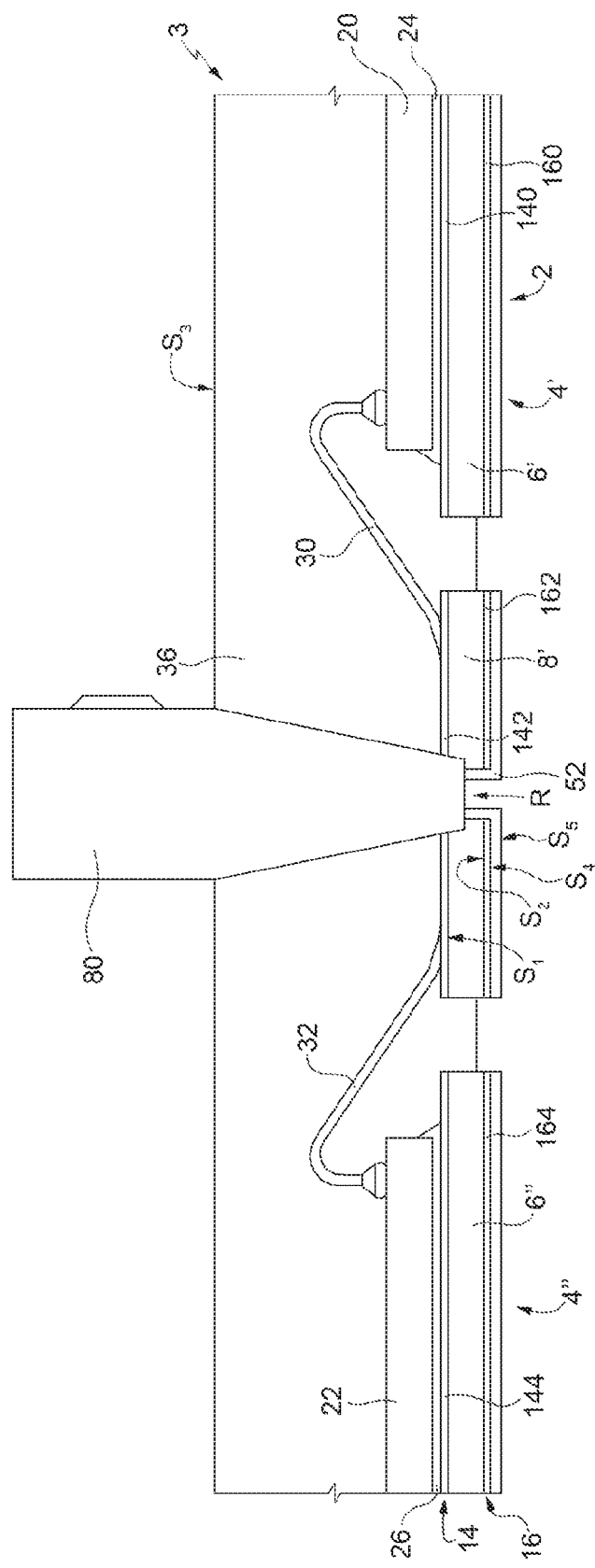

According to a variant of the manufacturing method of the present disclosure shown in FIG. 12, the second blade (here designated by 80) has a shape tapered downwards. In particular, at least one portion of the second blade 80 has the shape of a prism, the base of which has the shape of an isosceles trapezium, and the second cut is made in such a way that the third and fourth sidewalls $L_3$, $L_4$ are arranged transverse, but not perpendicular, to the longitudinal axis H of the split 55. Further, the third and fourth sidewalls $L_3$, $L_4$ converge towards the bottom portion 59 of the split 55.

Figure 13:
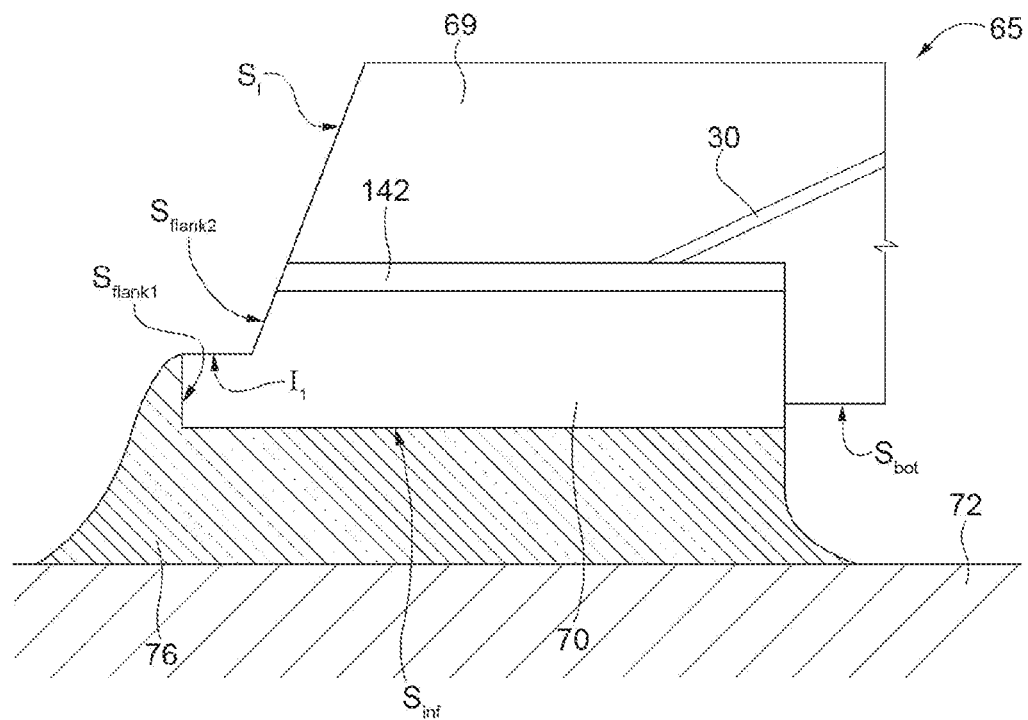
FIGS. 12 and 13 are schematic cross-sectional views that show successive steps of a variant of the present packaging method.

As shown in greater detail in FIG. 13, the package lateral surface $S_1$ is transverse, but not perpendicular, to the package bottom surface $S_{bot}$. Further, the second terminal lateral surface $S_{flank2}$ is still coplanar with the package lateral surface $S_1$, which is inclined with respect to the first terminal lateral surface $S_{flank1}$ by an angle, for example, between 8° and 12°. The second terminal lateral surface $S_{flank2}$ is, however, formed by the outer portion of the terminal 70, which is thus delimited at the top by the second terminal lateral surface $S_{flank2}$ itself, as well as by the first intermediate wall $I_1$, which is once again laterally staggered with respect to the second terminal lateral surface $S_{flank2}$.

In this way, visibility of the bond present between the terminal 70 and the printed-circuit board 72 is further improved. Further, the width of the first cut is in any case less than the minimum width of the second cut.

The manufacturing methods according to the teachings of the present disclosure provide certain advantages. In particular, the manufacturing methods of the present disclosure include carrying out a dual cutting process, between which a plating process is carried out (for example, by electroplating), such that the external lateral surfaces (also known as "flanks") of the terminals of the electronic device may be wetted by the solder paste used for soldering the terminals to the underlying board for facilitating inspection of the welds. Further, the present manufacturing method enables formation of conductive shoulders, which, in addition to having wettable lateral surfaces, are exposed upwards, such that a particularly wide angle of visual inspection is provided.

In addition, the present manufacturing method is particularly inexpensive and enables creation of terminals having a large weldable area.

In conclusion, it is clear that modifications and variations may be made to what has been described and illustrated, without thereby departing from the scope of the present invention, as defined in the annexed claims.

For example, the lead-frame strip may not to be of the pre-plated type, or in any case to be only partially pre-plated. For example, the second coating layer 16 may be absent. Further, the first coating layer 14 and/or the second coating layer 16 may have extensions different from what has been described. For example, the first coating layer 14 and/or the second coating layer 16 may coat only portions of the lead-frame strip 2.

If the second coating layer 16 is absent or does not extend underneath the contact region 8', the first and second sidewalls $L_1$, $L_2$, are entirely formed by the contact region 8'. It is further possible for the first coating layer 14 not to extend to the split 55, in which case said layer does not form the third and fourth sidewalls $L_3$, $L_4$.

As regards the third coating layer 52, instead of being of tin, this may be of an alloy with a base of lead and tin. In addition, it may not coat the top wall T.

It is further possible for the second terminal lateral surface $S_{flank2}$ not to be coplanar with the package lateral surface $S_1$.

As regards the cutting operations, it is possible for at least some of them to be carried out using a laser or a water jet, instead of using blades.

Finally, the electronic device may include more than one die.

The invention claimed is:

1. A method for manufacturing a surface-mount electronic device, comprising:
   making a first partial cut of an assembly including at least a first die pad and at least a second die pad and a first semiconductor body and a second semiconductor body, the first semiconductor body disposed on the first die pad and the second semiconductor body disposed on the second die pad, said assembly further including a plurality of terminal regions disposed between the first and second die pads, and a dielectric region overlying the first and second semiconductor bodies and the plurality of terminal regions, each terminal region being delimited by a first region surface and by a second region surface disposed opposite the first region surface, the first region surface facing the dielectric region, said first partial cut forming a recess by removing a portion of each of said terminal regions starting from the respective second region surfaces, said recess defined by a transverse wall and a first sidewall and a second sidewall;
   coating the first and second sidewalls of each terminal region with an anti-oxidation layer; and
   making a second partial cut of the assembly starting from the dielectric region, the second partial cut removing, for each terminal region, the transverse wall and separating the first and second semiconductor bodies; and
   wherein said second partial cut has a width greater than a width of the first partial cut.

2. The method according to claim 1, wherein said second partial cut is aligned with said recess to form a first recess and a second recess which communicate with one another.

3. The method according to claim 1, wherein said coating the first and second sidewalls comprises electroplating.

4. The method according to claim 1, wherein said coating the first and second sidewalls includes coating the corresponding transverse wall with said anti-oxidation layer.

5. The method according to claim 1, wherein said first and second partial cuts are made, respectively, using a first blade and a second blade, each blade having a rectangular cutting section.

6. The method according to claim 1, wherein said second partial cut is made with a second blade having a tapered shape for exposing, for each terminal region, a portion of the terminal region fixed with respect to the first semiconductor body and delimited by the corresponding first sidewall, an intermediate wall, and an oblique wall, the intermediate wall being connected to said first sidewall and to the oblique wall and being substantially perpendicular to said first sidewall, the oblique wall being inclined with respect to said first sidewall by an angle between 8° and 12°.

7. A method for manufacturing a surface-mount electronic device, comprising:
   applying a semiconductor material to a first die pad and a second die pad to form a first semiconductor die and second semiconductor die;

electrically connecting the first and second semiconductor dies to a terminal region, the terminal region being disposed between the first and second semiconductor dies;

applying a molding compound to the first semiconductor die, the terminal region, and the second semiconductor die, the molding compound applied to a top side of the terminal region;

making a first partial cut through a bottom side of the terminal region disposed opposite the top side of the terminal region to form a first recess, the first recess defined by a pair of sidewalls and a transverse wall, a distance between the sidewalls defining a first recess width;

coating the pair of sidewalls with an anti-oxidation layer; and making a second partial cut through the molding compound and the top side of the terminal region, a depth of the second partial cut extending into the first recess to sever the terminal region and a width of the second partial cut being greater than the first recess width.

8. The method according to claim 7, wherein coating the pair of sidewalls comprises electroplating the pair of sidewalls.

9. The method according to claim 8, further comprising electroplating the transverse wall.

10. The method according to claim 7, further comprising soldering the terminal region to a printed circuit board, the coating on one of the pair of sidewalls melting during the soldering.

11. The method according to claim 7, wherein electrically connecting the first and second semiconductor dies to the terminal region comprises wire bonding a first conductive wire to the terminal region and wire bonding a second conductive wire to the terminal region.

12. The method according to claim 7, wherein making the second partial cut comprises making a tapered cut such that a portion of the severed terminal region slopes away from a centerline of the first recess.

13. The method according to claim 12, wherein the portion of the severed terminal region slopes away from the centerline of the first recess at an angle between 8° and 12°.

14. The method according to claim 7, wherein a centerline of the second partial cut is aligned with a centerline of the first recess.

* * * * *